(12) United States Patent
Csato et al.

(10) Patent No.: US 12,731,753 B2
(45) Date of Patent: Sep. 8, 2026

(54) ENERGY FILTER ASSEMBLY FOR ION IMPLANTATION SYSTEM WITH AT LEAST ONE COUPLING ELEMENT

(71) Applicant: mi2-factory GmbH, Jena (DE)

(72) Inventors: Constantin Csato, Jena (DE); Florian Krippendorf, Jena (DE); André Zowalla, Jena (DE)

(73) Assignee: mi2-factory GMBH, Jena (DE)

( * ) Notice: Subject to any disclaimer, the term of this patent is extended or adjusted under 35 U.S.C. 154(b) by 608 days.

(21) Appl. No.: 18/266,733

(22) PCT Filed: Dec. 7, 2021

(86) PCT No.: PCT/EP2021/084473
§ 371 (c)(1),
(2) Date: Jun. 12, 2023

(87) PCT Pub. No.: WO2022/128593
PCT Pub. Date: Jun. 23, 2022

(65) Prior Publication Data
US 2024/0047168 A1 Feb. 8, 2024

(30) Foreign Application Priority Data
Dec. 17, 2020 (LU) ........................................ 102299

(51) Int. Cl.
*H01J 37/05* (2006.01)
*H01J 37/147* (2006.01)
*H01J 37/317* (2006.01)

(52) U.S. Cl.
CPC .......... *H01J 37/05* (2013.01); *H01J 37/1474* (2013.01); *H01J 37/3171* (2013.01); *H01J 2237/057* (2013.01)

(58) Field of Classification Search
CPC .... H01J 37/05; H01J 37/1474; H01J 37/3171; H01J 2237/057; H01J 2237/0456; H01J 2237/0475; H01J 2237/31701
USPC ................................ 250/492.1–492.3, 505.1
See application file for complete search history.

(56) References Cited

U.S. PATENT DOCUMENTS

2019/0122850 A1* 4/2019 Krippendorf ....... H01J 37/3172

FOREIGN PATENT DOCUMENTS

| | | | |
|---|---|---|---|
| DE | 102011075350 | A1 | 11/2012 |
| DE | 102016106119 | B4 | 10/2017 |
| DE | 102019120623 | A1 | 2/2021 |
| EP | 0014516 | B1 | 8/1980 |
| JP | S55102226 | A | 8/1980 |
| JP | 2007523440 | A | 8/2007 |
| JP | 2018014486 | A | 1/2018 |
| JP | 2019522326 | A | 8/2019 |
| JP | 2020513645 | A | 5/2020 |
| JP | 2022532048 | A | 7/2022 |
| JP | 2022532999 | A | 7/2022 |

(Continued)

*Primary Examiner* — Michael Maskell
(74) *Attorney, Agent, or Firm* — 24IP USA, PLLC; Timothy R DeWitt

(57) ABSTRACT

An energy filter assembly (1, 100, 200, 300) for ion implantation system is provided comprising an energy filter (25), a first filter frame (40), and at least one coupling element (50). The energy filter (25) has at least one filter element (25*a*) absorbing the beam energy of an ion beam (10). The at least one coupling element (50) elastically connects the first filter frame (40) with the energy filter (25).

28 Claims, 8 Drawing Sheets

(56) References Cited

FOREIGN PATENT DOCUMENTS

| | | | |
|---|---|---|---|
| JP | 2022542658 | A | 10/2022 |
| WO | 2016079051 | A2 | 5/2016 |

* cited by examiner

ENERGY FILTER ASSEMBLY FOR ION IMPLANTATION SYSTEM WITH AT LEAST ONE COUPLING ELEMENT

FIELD OF THE INVENTION

The invention relates to an energy filter assembly for ion implantation system comprising at least one coupling element for elastically connecting a first filter frame with the energy filter. The invention relates also to methods for manufacturing such energy filter assembly. The invention further relates to a method for filtering ion implantation with such energy filter assembly.

BACKGROUND OF THE INVENTION

Ion implantation is a method to achieve doping or production of defect profiles in a material, such as semiconductor material or an optical material, with predefined depth profiles in the depth range of a few nanometers to several tens of micrometers. Examples of such semiconductor materials include, but are not limited to silicon, silicon carbide, and gallium nitride. Examples of such optical materials include, but are not limited to, $LiNbO_3$, glass and PMMA.

There is a need to produce depth profiles by ion implantation which have a wider depth distribution than that of a doping concentration peak or defect concentration peak obtainable by monoenergetic ion irradiation, or to produce doping or defect depth profiles which cannot be produced by one or a few simple monoenergetic implantations. The doping concentration peak can often be described approximately by a Gauss distribution or more precisely by a Pearson distribution. However, there are also deviations from such distributions, especially when so-called channeling effects are present in crystalline material. Prior art methods are known for producing the depth profile use a structured energy filter in which the energy of a monoenergetic ion beam is modified as the monoenergetic ion beam passes through a micro-structured energy filter component. The resulting energy distribution leads to a creation of the depth profile ions in the target material. This is described, for example, in European Patent Nr. 0 014 516 B1 (Bartko).

An example of such an ion implantation device 20 is shown in FIG. 1 in which an ion beam 10 impacts a structured energy filter 25. The ion beam source 5 could also be a cyclotron, a rf-linear accelerator, an electrostatic tandem accelerator or a single-ended-electrostatic accelerator. In other aspects, the energy of the ion beam source 5 is between 0.5 and 3.0 MeV/nucleon or preferably between 1.0 and 2.0 MeV/nucleon. In one specific embodiment, the ion beam source produces an ion beam 10 with an energy of between 1.3 and 1.7 MeV/nucleon. The total energy of the ion beam 10 is between 1 and 50 MeV, in one preferred aspect, between 4 and 40 MeV, and in a preferred aspect between 8 and 30 MeV. The frequency of the ion beam 10 could be between 1 Hz and 2 kH, for example between 3 Hz and 500 Hz and, in one aspect, between 7 Hz and 200 Hz. The ion beam 10 could also be a continuous ion beam 10. Examples of the ions in the ion beam 10 include, but are not limited to aluminum, nitrogen, hydrogen, helium, boron, phosphorous, carbon, arsenic, and vanadium.

In FIG. 1 it will be seen that the energy filter 25 is made from a membrane having a triangular cross-sectional form on the right-hand side, but this type of cross-sectional form is not limiting of the invention and other cross-sectional forms could be used. The upper ion beam 10-1 passes through the energy filter 25 with little reduction in energy because the area $25_{min}$ through which the upper ion beam 10-1 passes through the energy filter 25 is a minimum thickness of the membrane in the energy filter 25. In other words, if the energy of the upper ion beam 10-1 on the left-hand side is E1 then the energy of the upper ion beam 10-1 will have substantially the same value E1 on the right-hand side (with only a small energy loss due stopping power of the membrane which leads to absorption of at least some of the energy of the ion beam 10 in the membrane).

On the other hand, the lower ion beam 10-2 passes through an area $25_{max}$ in which the membrane of the energy filter 25 is at its thickest. The energy E2 of the lower ion beam 10-2 on the left-hand side is absorbed substantially by the energy filter 25 and thus the energy of the lower ion beam 10-2 on the right-hand side is reduced and is lower than the energy of the upper ion beam, i.e. E1>E2. The result is that the more energetic upper ion beam 10-1 is able to penetrate a greater depth in the substrate material 30 than the less energetic lower ion beam 10-2. This results in a differential depth profile in the substrate material 30, which is part of a wafer.

This depth profile is shown on the right-hand side of the FIG. 1. The solid rectangular area shows that the ions penetrate the substrate material at a depth between d1 and d2. However, the horizontal profile shape is a special case, which is only obtained if all energies are geometrically equally considered and if the material of the energy filter and the substrate is the same. The Gaussian curve shows the approximate depth profile without an energy filter 25 and having a maximum value at a depth of d3. It will be appreciated that the depth d3 is larger than the depth d2 since some of the energy of the ion beam 10-1 is absorbed in the energy filter 25.

In the prior art there are a number of principles known for the fabrication of the energy filter 25. Typically, the energy filter 25 will be made from bulk material with the surface of the energy filter 25 etched to produce the desired pattern, such as the triangular cross-sectional pattern known from FIG. 1. In German Patent No DE 10 2016 106 119 B4 (Csato/Krippendorf) an energy filter was described which was manufactured from layers of materials which had different ion beam energy reduction characteristics. The depth profile resulting from the energy filter described in the Csato/Krippendorf patent application depends on the structure of the layers of the material as well as on the structure of the surface.

A further construction principle is shown in the Applicant's co-pending application DE 10 2019 120 623.5, in which the energy filter comprises spaced micro-structured layers which are connected together by vertical walls.

The maximum power from the ion beam 10 that can be absorbed through the energy filter 25 depends on three factors: the effective cooling mechanism of the energy filter 25; the thermo-mechanical properties of the membrane from which the energy filter 25 is made, as well as the choice of material from which the energy filter 25 is made. In a typical ion implantation process around 50% of the power is absorbed in the energy filter 25, but this can rise to 80% depending on the process conditions and filter geometry.

An example of the energy filter is shown in FIG. 2 in which the energy filter 25 is made of a triangular structured membrane mounted in a frame 27. In one non-limiting example, the energy filter 25 can be made from a single piece of material, for example, silicon on insulator which comprises an insulating layer silicon dioxide layer 22 having, for example a thickness of 0.2-1 μm sandwiched between a silicon layer 21 (of typical thickness between 2 and 20 μm, but up to 200 μm) and bulk silicon 23 (around 400 μm thick). The structured membrane is made, for example, from silicon, but could also be made from silicon carbide or another silicon-based or carbon-based material or a ceramic.

In order to optimize the wafer throughput in the ion implantation process for a given ion current for the ion beam 10 and thus use the ion beam 10 efficiently, it is preferred to only irradiate the membrane of the energy filter 25 and not the frame 27 in which the membrane is held in place. In reality, it is likely that at least part of the frame 27 will also be irradiated by the ion beam 10 and thus heat up. It is indeed possible that the frame 27 is completely irradiated. The membrane forming the energy filter 25 is heated up but has a very low thermal conductivity as the membrane is thin (i.e. between 2 μm and 20 μm, but up to 200 μm). The membranes are between 2×2 $cm^2$ and 35×35 $cm^2$ in size and correspond to the size of the target wafers. There is little thermal conduction between the membranes and the frame 27. Thus, the monolithic frame 27 does not contribute to the cooling of the membrane and the only cooling mechanism for the membrane which is relevant is the thermal radiation from the membrane.

The localized heating of the membrane in the energy filter 25 results in addition to thermal stress between the heated parts of the membrane forming the energy filter 25 and the frame. Furthermore, the localized heating of the membrane due to absorption of energy from the ion beam 10 in only parts of the membrane, e.g. due to electrostatic or mechanical scan of the beam or mechanical motion of the filter relative to the beam, also results in thermal stress within the membrane and can lead to mechanical deformation or damage to the membrane. The heating of the membrane also occurs within a very short period of time, i.e. less than a second and often in the order of milliseconds. The cooling effect occurs during or shortly after a local instantaneous irradiation, because adjacent or more distant areas of the filter have a lower temperature than the instantaneously irradiated areas. The problem is that there is practically no heat conduction to provide heat equalization. This inhomogeneous temperature distribution is particularly noticeable for pulsed ion beams 10 and scanned ion beams 10. These temperature gradients can lead to defects and formation of separate phases within the material from which the membrane of the energy filter 25 is made, and even to unexpected modification of the material.

In the past the issue was that in all process phases of ion implantation (i.e. the time before irradiation, the phase of heating the membrane (local or global) by the ion beam, the actual irradiation (local or global), the cooling phase after removal of the ion beam (local or global) and the termination of the implantation process) tensions and the associated risk of membrane damage due to cracking, increased brittleness, etc. may occur more frequently.

A major drawback of an energy filter assembly for ion implantation system with monolithic edge is the transition from the edge (full wafer thickness, some 100 μm) to the actual energy filter membrane (typical thickness~20 μm). With the same irradiation power on the filter frame and the energy filter, the resulting heating at the transition will be greater than the heating of the thin membrane due to the high thermal conductivity of the solid edge and the resulting large heat capacity. As a result, a temperature gradient in the transition region may arise and lead to thermomechanical stress. The practical aspect is further complicated by the fact that irradiating the filter frame and membrane with the same power each time is not a preferred process variant for reasons of maximizing the wafer throughput, since the losses of non-transmitted ions are very high in this case.

Therefore, it is an object of the present invention to provide an energy filter assembly for ion implantation system with a mechanically decoupled energy filter to reduce or avoid the stresses or their effects and the associated risk of damage to the energy filter membrane through cracking of the membrane, increased brittleness of the membrane or similar issues during the process phases.

Therefore, there is a need to improve the energy filter assembly for ion implantation system to improve the mechanical stability and thermomechanical stability of the energy filter.

SUMMARY OF THE INVENTION

According to a first aspect of the invention, an energy filter assembly for ion implantation system is provided comprising an energy filter, a first filter frame, and at least one coupling element. The energy filter has at least one filter element absorbing the beam energy of an ion beam. The at least one coupling element elastically connects the first filter frame with the energy filter.

In one aspect of the energy filter assembly, the at least one coupling element is arranged at the at least one filter element of the energy filter.

In a second aspect of the energy filter assembly, the energy filter assembly further comprises a second filter frame accommodating the energy filter, wherein the at least one coupling element elastically connects the first filter frame with the second filter frame.

In one aspect of the energy filter assembly, the at least one coupling element is configured as a micro spring element. The micro spring element can have a thickness of 6 μm, 16 μm or several 100 μm. The micro spring element can also have width of 50 μm, 100 μm and a length of 100 μm up to several mm.

In one aspect of the energy filter assembly, the at least one coupling element is integrally formed with at least one of the energy filter and the first filter frame.

In one aspect of the energy filter assembly, the at least one coupling element is integrally formed with at least one of the first filter frame and the second filter frame.

In further aspect of the energy filter assembly, the at least one coupling element is connected to the energy filter and the first filter frame, and the second filter frame by laser welding or a bonding technique or at least one mechanical fixture.

In one aspect of the energy filter assembly, the at least one filter element is triangular prism-shaped or pyramidically shaped or free form-shaped.

In a further aspect of the energy filter assembly, the at least one filter element is arranged in a plane, which is perpendicular to the beam direction of the ion beam.

In a third aspect of the energy filter assembly, the energy filter assembly further comprises at least one aperture element and a substrate. The at least one aperture element is arranged in a plane, which is perpendicular to the beam direction of the ion beam. The at least one aperture element is further arranged between the energy filter and the substrate such that a filtered ion beam is transmitted only through the filter to the substrate.

In further aspect of the energy filter assembly, the substrate is fixed with respect to the transmitted ion beam or the substrate is movable in at least one of a first direction and a second direction perpendicular to the beam direction of the transmitted ion beam.

In another aspect of the energy filter assembly, the energy filter assembly further comprises at least one detecting element scanning the ion beam in at least one minimal scanning area. The at least one detecting element is scanning the ion beam in a scanning area, wherein the scanning area extends beyond the at least one detecting element. The detecting element can be a Faraday Cup.

In further aspect of the energy filter assembly, the at least one filter element is made of silicon, silicon carbide or carbon.

In a fourth aspect of the energy filter assembly, the at least one coupling element is preloaded for keeping the connection between the first filter frame and the energy filter under a controlled tension. The at least one coupling element is preloaded for keeping the connection between the first filter frame and the energy filter under a controlled tension in particular for the case of thermal expansion of the filter during ion irradiation. The preloaded at least one coupling element is further configured that the controlled tension on the energy filter is below a maximal tolerable tension including a safety value within the entire allowed temperature range during operation. The at least one coupling element can be provided as a micro tension spring element.

According to a fifth aspect of the invention, a method for manufacturing an energy filter assembly for ion implantation system is provided comprising the steps of: providing an energy filter having at least one filter element, which at least partially absorbs the beam energy of an ion beam; providing a first filter frame; and connecting the first filter frame with the energy filter by at least one coupling element for elastically connecting the first filter frame with the energy filter.

In one aspect of the method for manufacturing an energy filter assembly, the method further comprises the steps of: providing a second filter frame accommodating the energy filter; and connecting elastically the at least one coupling element between the first filter frame with the second filter frame.

According to a sixth aspect of the invention, a method for filtering ion implantation is provided comprising the steps of: providing an energy filter assembly comprising an energy filter having at least one filter element, wherein a first filter frame is elastically connected with the energy filter by at least one coupling element and wherein at least one aperture element is arranged between the energy filter and a substrate; providing an ion beam extending across the energy filter, and the at least one coupling element; and arranging the at least one aperture element with respect to the direction of the ion beam, such that non-filtered ions of the ion beam are stopped from impacting on the substrate.

In one aspect of the method for filtering ion implantation, the method further comprises the step of scanning the ion beam beyond the energy filter, the at least one coupling element, and the first filter frame such that at least one detecting element is irradiated.

According to a seventh aspect of the invention, a further method for manufacturing an energy filter assembly for an ion implantation system is provided comprising the steps of: providing a silicon-on-insulator (SOI) wafer as a substrate material having a first surface and a second surface, wherein the thickness of a buried oxide (BOX) varies between 30 nm and 1.5 μm thickness; applying a first masking material layer and a second masking material layer for masking wet chemical potassium hydroxide (KOH) etching or tetramethylammonium hydroxide (TMAH) etching to the first surface and the second surface of the SOI wafer; patterning the first masking material layer and the second masking material layer on the first surface and the second surface by using a first and second lithography process step and at least one wet or dry etching patterning step; cleaning of the first and second surfaces after patterning of the masking material layers; first wet chemical etching of the first or second surfaces using KOH or TMAH etchant; removing of the first masking material layer; applying a third masking material layer on the first surface, for masking a KOH or TMAH wet etching step OR dry etching step to the first surface of the SOI wafer; patterning the third masking material layers on the first surface by using a third lithography process step and at least one wet or dry etching patterning step; applying a KOH or TMAH wet etching step OR dry etching step to the first surface of the SOI wafer stopping on the BOX layer; Second wet chemical etching of the first or the second surface using KOH or TMAH etchant; Third wet chemical etching or dry etching of the second surface such that etching is stopped on the BOX layer; removing of the BOX layer; and removing of the masking layers on the first and second surfaces.

In one aspect of the method for manufacturing an energy filter assembly, the method further comprises the steps of: applying a first protective layer to the second surface to prevent etching and/or applying a second protective layer to the first or the second surface to prevent etching of the first surface.

According to an eighth aspect of the invention, a further method for manufacturing an energy filter assembly for an ion implantation system is provided comprising the steps of: providing a volume material slab; sequentially removing of the material by a laser etching or mechanical erosive device, wherein the removing is incremental several 10 nm up to several micrometer per step and involves several removal steps for a given structure, and wherein the sequentially removing is performed according to a predefined 3-D layout of an energy filter, a first filter frame, and at least one coupling element for elastically connecting the first filter frame with the energy filter.

According to a ninth aspect of the invention, a further method for manufacturing an energy filter assembly for an ion implantation system is provided comprising the steps of: providing a substrate or base layer; depositing a first filter layer for providing an energy filter and a first filter frame layer for providing a first filter frame; patterning the first filter layer and the first filter frame layer using suitable etching techniques like masked etching or sequential etching by a laser or ion beam etching device; depositing and patterning sequentially multiples of first filter layers and first filter frame layers; removing, grinding or etching the substrate or base layer to a desired substrate layer thickness or base layer thickness; and removing, grinding or etching the first filter layers and first filter frame layers cutting out at least one coupling element for elastically connecting the first filter frame with the energy filter.

According to a tenth aspect of the invention, a further method for manufacturing an energy filter assembly for an ion implantation system is provided comprising the steps of: providing an energy filter; providing a first filter frame; creating at least one elastic element between the energy filter and the first filter frame by laser ablation; and separating the energy filter from first filter frame by material ablation.

DESCRIPTION OF THE FIGURES

The invention will now be described on the basis of figures. It will be understood that the embodiments and aspects of the invention described in the figures are only examples and do not limit the protective scope of the claims in any way. The invention is defined by the claims and their equivalents. It will be understood that features of one aspect or embodiment of the invention can be combined with a feature of a different aspect or aspects of other embodiments of the invention. This invention becomes more obvious when reading the following detailed descriptions of some examples as part of the disclosure under consideration of the enclosed drawings, in which:

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention. The object of the present invention is fully described below using examples for the purpose of disclosure, without limiting the disclosure to the examples. The examples present different aspects of the present invention. To implement the present technical teaching, it is not required to implement all of these aspects combined. Rather, a specialist will select and combine those aspects that appear useful and required for the corresponding application and implementation.

Figure 1:
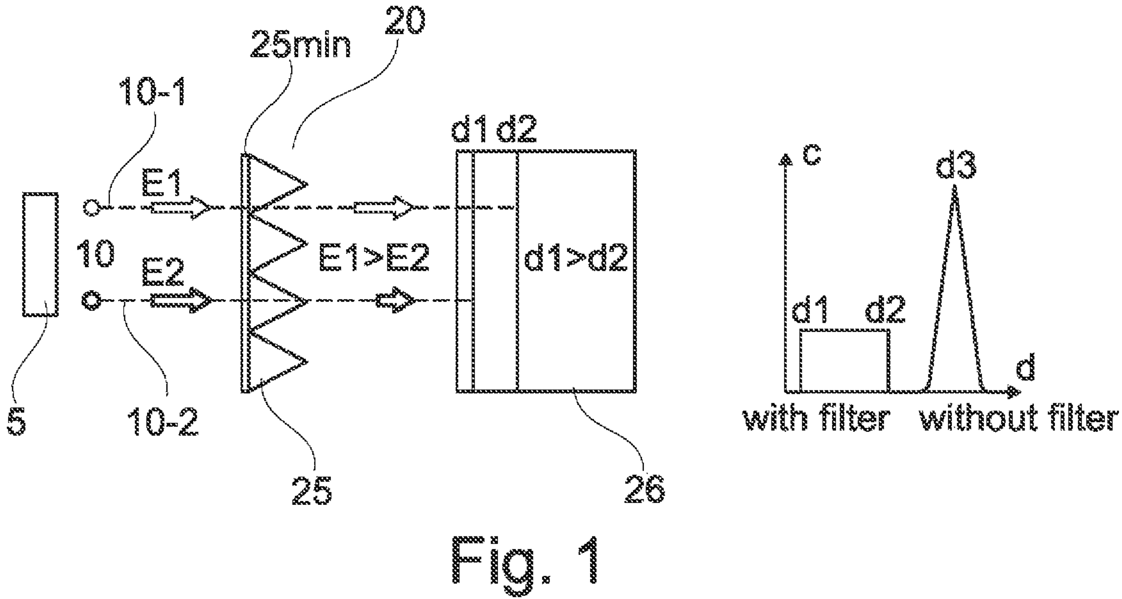
FIG. 1 shows the principle of the ion implantation device with an energy filter as known in the prior art.
Figure 2:
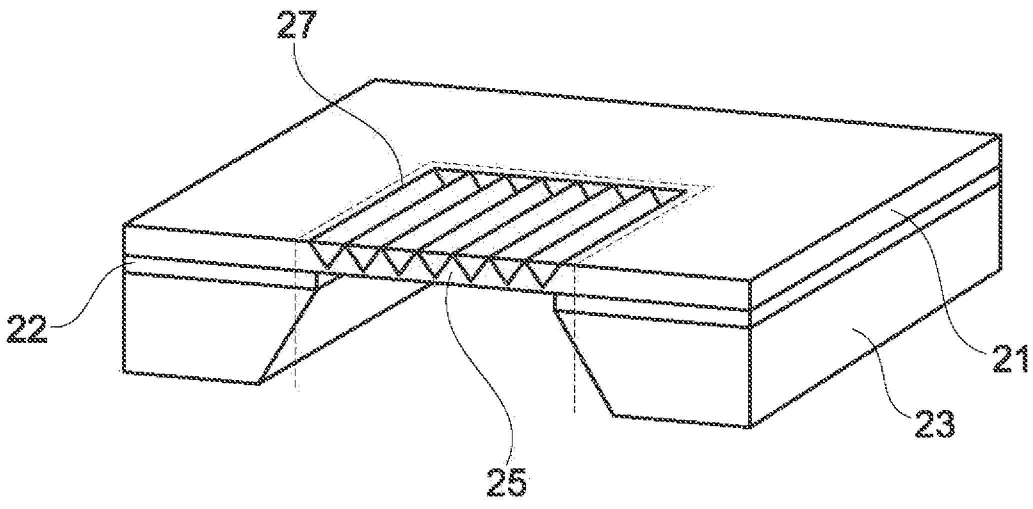
FIG. 2 shows a structure of the ion implantation device with the energy filter.
Figure 3A:
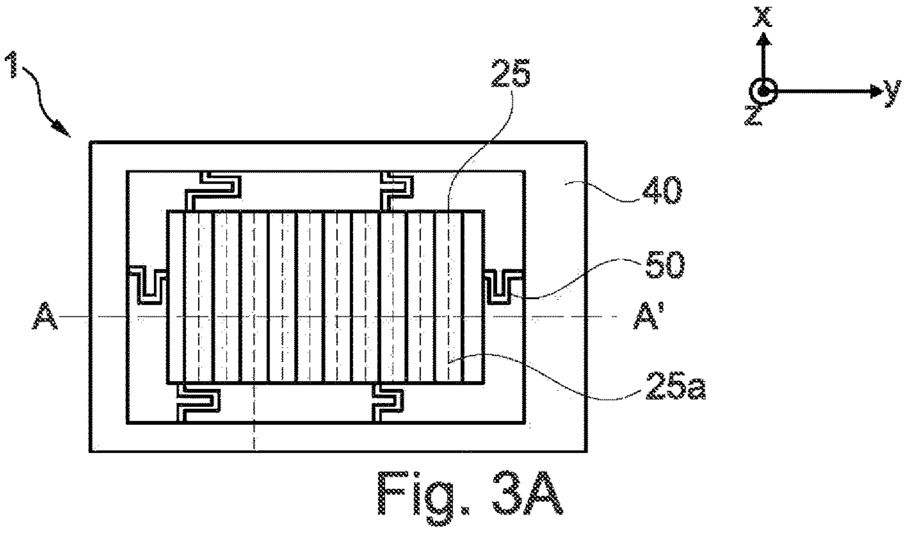
FIG. 3A shows a top view of an energy filter assembly for ion implantation system according to a first aspect of the present invention with at least one coupling element for elastically connecting a first filter frame with an energy filter.
Figure 3B:
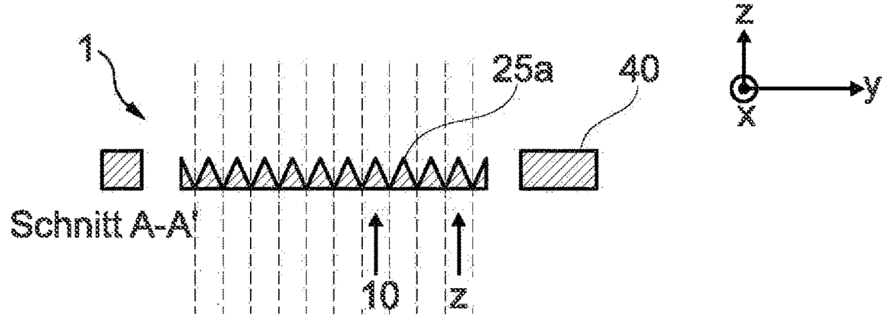
FIG. 3B shows a cross section of the energy filter assembly with the section lines A-A' of FIG. 3A.

FIG. 3A shows a top view of an energy filter assembly 1 for ion implantation system according to a first aspect of the present invention. FIG. 3B shows a cross section of the energy filter assembly 1 with the section lines A-A' of FIG. 3A. As can be seen in FIGS. 3A and 3B, the energy filter assembly 1 comprises an energy filter 25 having at least one filter element 25*a*, which at least partially absorbs the beam energy of an ion beam 10. The energy filter assembly 1 further comprises a first filter frame 40 and at least one coupling element 50, wherein the at least one coupling element 50 elastically connects the first filter frame 40 with the energy filter 25. The at least one filter element 25*a* of the energy filter 25 is made from a membrane having a cross section with a triangular prism-shape, but this type of cross-sectional form is not limiting of the present invention and other cross-sectional forms could be used, as needed and/or desired. For example, the at least one filter element 25*a* of the energy filter 25 can be made from a membrane having a pyramidically shape or a free form-shape.

The at least one filter element 25*a* can be made of silicon, silicon carbide or carbon, but this type of material is not limiting of the present invention and other materials could be used, as needed and/or desired. As can be seen in FIG. 3A, the at least one coupling element 50 is arranged at the at least one filter element 25*a* of the energy filter 25. As can be seen further in FIG. 3A, the at least one coupling element 50 is also arranged at the first filter frame 40. The at least one coupling element 50 can be integrally formed with at least one part of the energy filter 25. The at least one coupling element 50 can also be integrally formed with at least one part of the first filter frame 40. However, the least one coupling element 50 can also be separately formed with at least one part of the energy filter 25. The least one coupling element 50 can also be separately formed with at least one part of the first filter frame 40. The at least one coupling element 50 can be connected to the energy filter 25 and to the first filter frame 40 by laser welding or a bonding technique or at least one mechanical fixture, but this type of connection is not limiting of the present invention and other connecting techniques could be used, as needed and/or desired. As can be seen in FIG. 3B, the at least one filter element 25*a* is arranged in a plane X, Y, which is perpendicular to a beam direction Z of the ion beam 10 irradiated via the ion beam source 5 (not shown).

In the first aspect of the present invention, the energy filter assembly 1 comprises five coupling elements 50, wherein two of the coupling elements 50 are arranged on each longitudinal side of the energy filter 25 and one of the coupling elements 50 is arranged on each wide side of the energy filter 25. However, in the first aspect of the present invention, the two coupling elements 50 can also be arranged on each wide side of the energy filter 25 and one of the coupling elements 50 can be arranged on each longitudinal side of the energy filter 25. Further, in the first aspect of the present invention, the number of coupling elements 50 is not limited by the present invention. The energy filter assembly 1 can comprise more or less than five coupling elements 50. In a further aspect of the present invention, the energy filter assembly 1 can also comprise one single coupling element 50, which elastically connects the first filter frame 40 with the energy filter 25. In a further aspect of the present invention, the at least one coupling element 50 can be arranged on the top surface and/or bottom surface of the energy filter 25 for elastically connecting the first filter frame 40 with the energy filter 25.

With the energy filter assembly 1 for ion implantation system according to the first aspect of the present invention, the at least one coupling element 50 can be configured as a micro spring element. The micro spring element can have a thickness of 6 μm, 16 μm or several 100 μm. The micro spring element 50 can have a width of 50 μm, 100 μm and a length of 100 μm up to several mm. However, this type of coupling element 50 is not limiting of the present invention and other types of coupling elements could be used, as needed and/or desired.

Figure 4A:
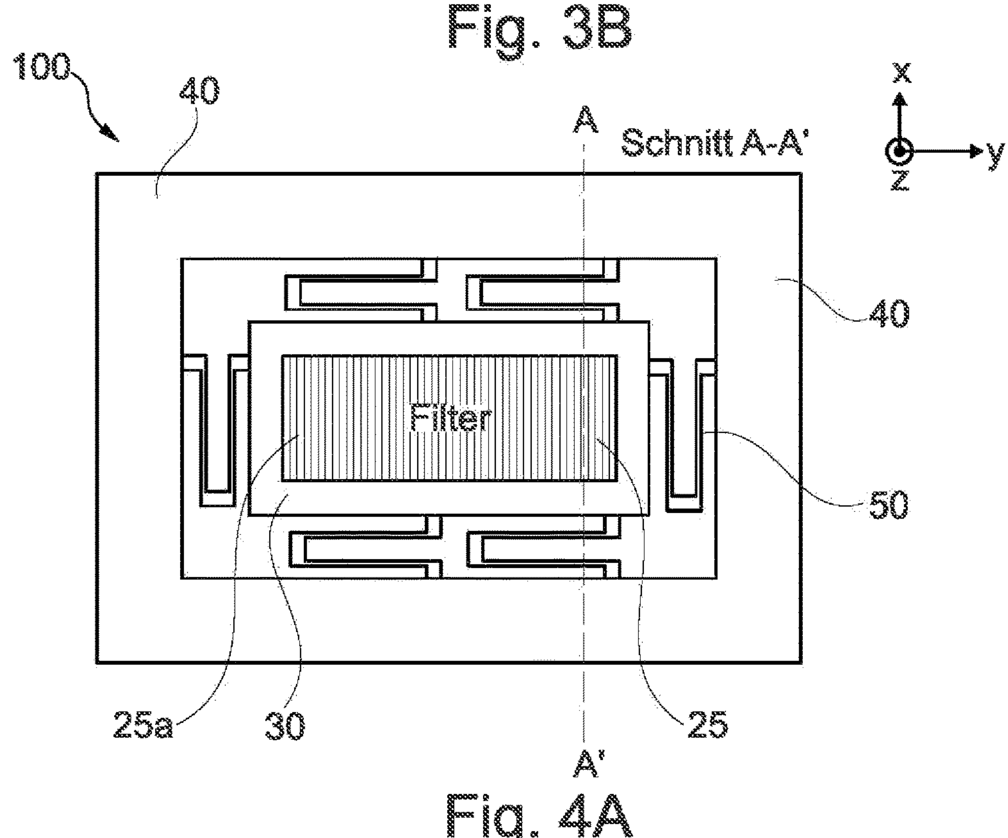
FIG. 4A shows a top view of an energy filter assembly for ion implantation system according to a second aspect of the present invention with at least one coupling element elastically connecting the first filter frame with a second filter frame accommodating the energy filter.
Figure 4B:
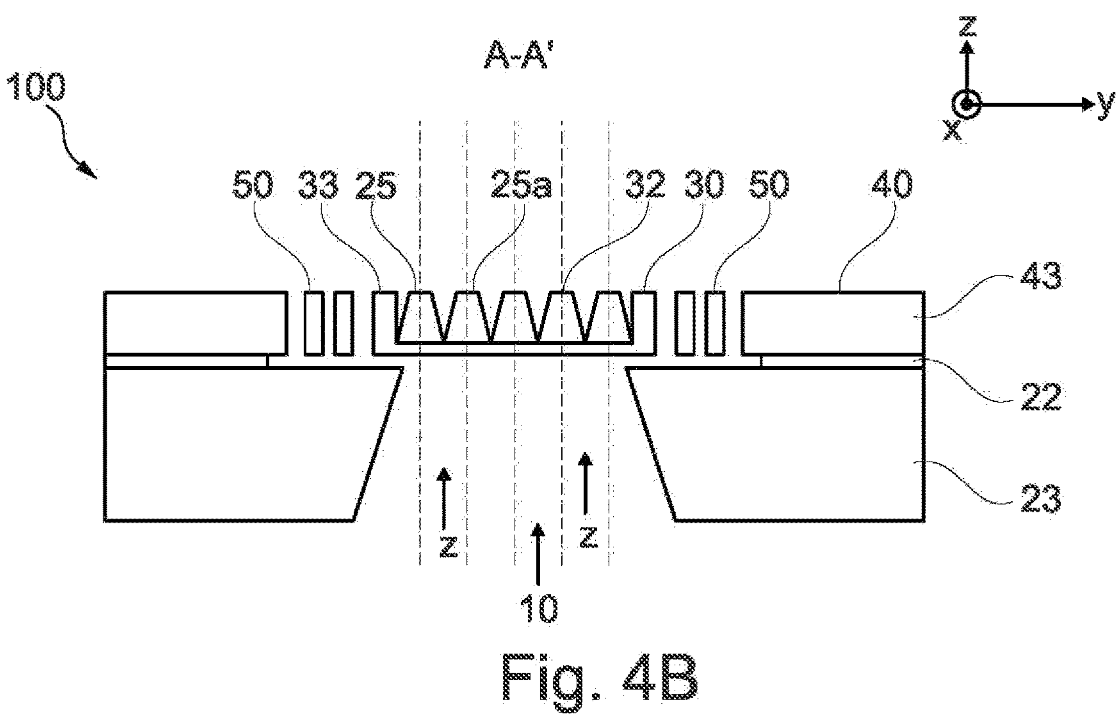
FIG. 4B shows a cross section of the energy filter assembly with the section lines A-A' of FIG. 4A.

FIG. 4A shows a top view of an energy filter assembly 100 for ion implantation system according to a second aspect of the present invention. FIG. 4B shows a cross section of the energy filter assembly 100 with the section lines A-A' of FIG. 4A. The energy filter assembly 100 for ion implantation system according to the second aspect of the present invention comprises the same configuration as the filter assembly 1 in accordance with the first aspect of the present invention. Thus, elements having substantially the same function as those in the first aspect of the present invention will be numbered the same here and will not be described and/or illustrated again in detail here for the sake of brevity. As can be seen in FIG. 4A, the energy filter assembly 100 further comprises a second filter frame 30 accommodating the energy filter 25, wherein the at least one coupling element 50 elastically connects the first filter frame 40 with the second filter frame 30.

As can be seen in FIG. 4A, in the second aspect of the present invention, the at least one coupling element 50 is arranged at the second filter frame 30 accommodating the at least one filter element 25*a* of the energy filter 25. As can be seen further in FIG. 4A, the at least one coupling element 50 is also arranged at the first filter frame 40. The at least one coupling element 50 can be integrally formed with at least one part of the second filter frame 30. The least one coupling element 50 can also be integrally formed with at least one part of the first filter frame 40. However, the at least one coupling element 50 can also be separately formed with at least one part of the second filter frame 30. The least one coupling element 50 can also be separately formed with at least one part of the first filter frame 40. The at least one coupling element 50 can be connected to the second filter frame 30 and to the first filter frame 40 by laser welding or a bonding technique or at least one mechanical fixture, but this type of connection is not limiting of the present invention and other connecting techniques could be used, as needed and/or desired. Further, in the second aspect of the present invention, the number of coupling elements 50 is not limited by the present invention. The energy filter assembly 100 can comprise more than five coupling elements 50 or less than five coupling elements 50. In a further aspect of the present invention, the energy filter assembly 100 can also comprise one single coupling element 50, which elastically connects the first filter frame 40 with the second filter frame 30. In a further aspect of the present invention, the at least one coupling element 50 can be arranged on the top surface and/or bottom surface of the second filter frame 30 for elastically connecting the first filter frame 40 with the energy filter 25 via the second filter frame 30.

As can be seen in FIG. 4B, in the second aspect of the present invention, the at least one filter element 25*a* is arranged in a plane X, Y, which is perpendicular to a beam direction Z of the ion beam 10 irradiated via the ion beam source 5 (not shown). As can be seen in FIG. 4B, the energy filter assembly 100 comprises an insulating layer silicon dioxide layer 22 having, for example a thickness of 0.3-1.5 μm sandwiched between the first filter frame 40 and a bulk silicon 23 (around 400 μm thick). However, the present invention is not limited thereto, the insulating layer silicon dioxide layer 22 can be omitted and another connecting layer can be used, as needed and/or desired. As can be seen in FIG. 4B, the energy filter 25 has at least one filter layer 32 with a layer thickness having a minimum thickness of the membrane. The energy filter 25 can be configured as having one single filter layer 32 or having a plurality of filter layers 32. For example, the energy filter 25 can be made having five filter layers 32 with each of the five filter layers 32 having a layer thickness with a minimum thickness of the membrane. The amount of filter layers 32 is not limiting of the present invention. Further, as can be seen in FIG. 4B, the first filter frame 40 has at least one first filter frame layer 43 with a layer thickness having a minimum thickness. The first filter frame 40 can be configured as having one single first filter frame layer 43 or having a plurality of first filter frame layers 43. The amount of first filter frame layers 43 is not limiting of the present invention. Further, as can be seen in FIG. 4B, the second filter frame 30 has at least one second filter frame layer 33 with a layer thickness having a minimum thickness. The second filter frame 30 can be configured as having one single second filter frame layer 33 or having a plurality of second filter frame layers 33. The amount of second filter frame layers 33 is not limiting of the present invention.

Figure 5A:
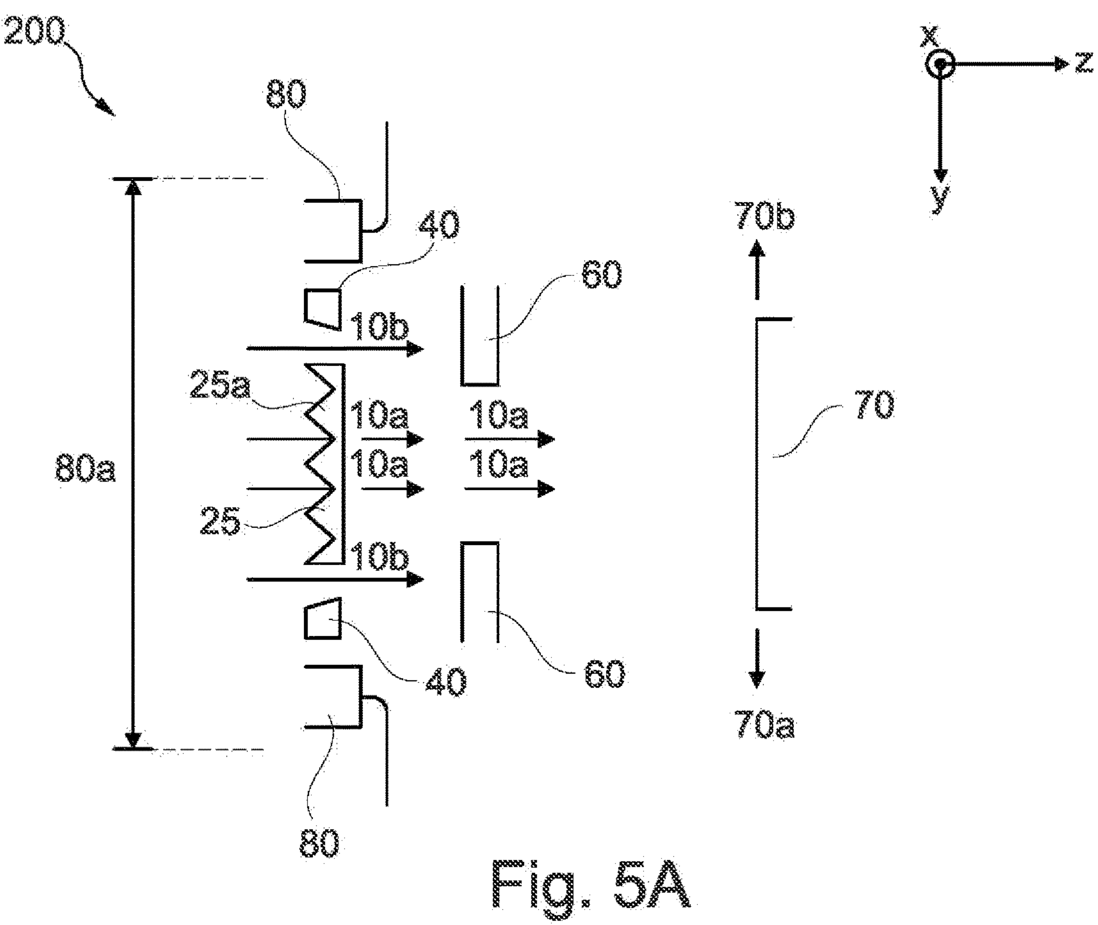
FIG. 5A shows a cross section of an energy filter assembly for ion implantation system according to a third aspect of the present invention with at least one aperture element and a substrate, wherein the at least one aperture element is arranged between the energy filter and the substrate.
Figure 5B:
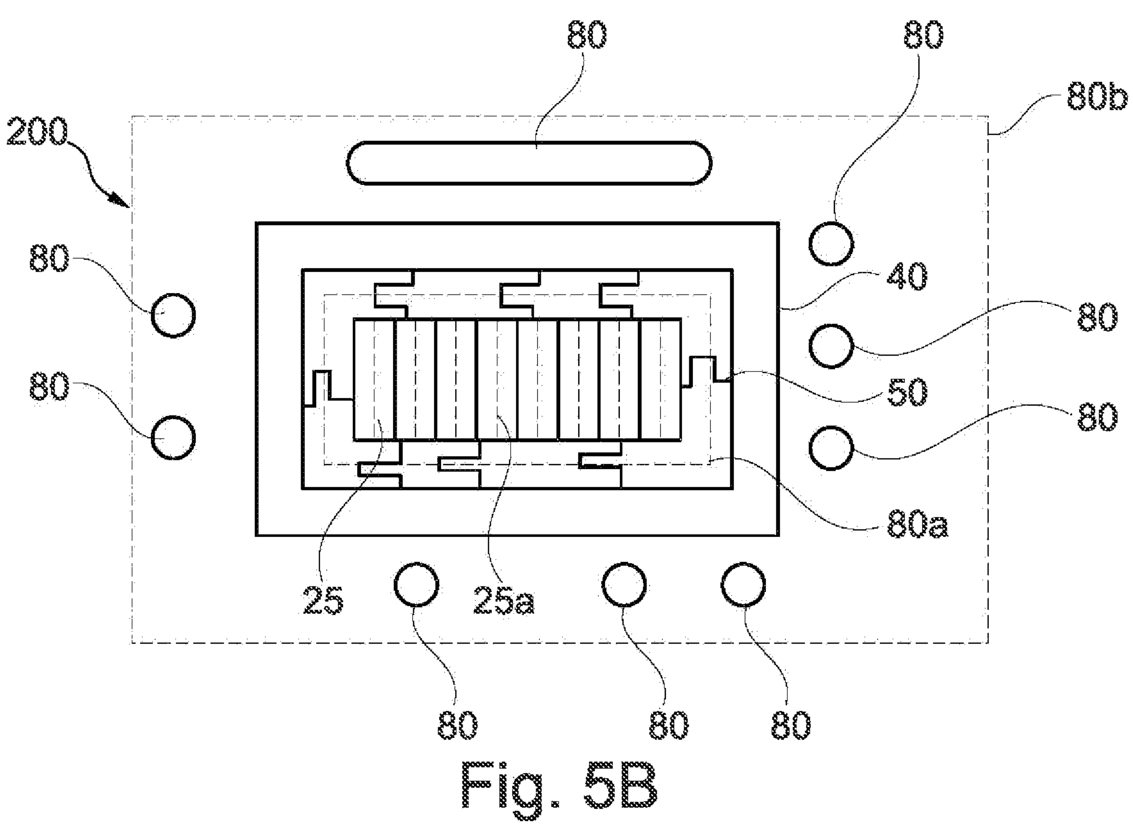
FIG. 5B shows a top view of the energy filter assembly of FIG. 5A with at least one detecting element scanning the ion beam in at least one minimal scanning area.
Figure 5C:
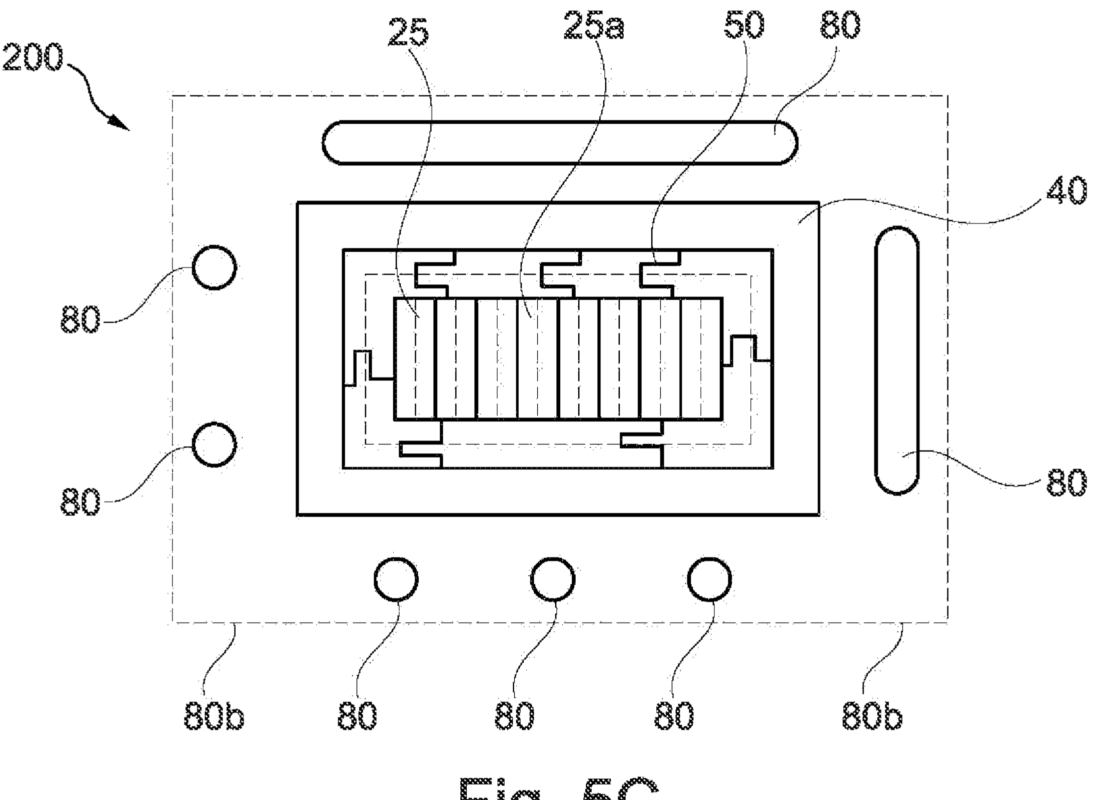
FIG. 5C shows a top view of the energy filter assembly of FIG. 5A with at least one detecting element scanning the ion beam in a scanning area, which extends beyond the at least one detecting element.

FIG. 5A shows a cross section of an energy filter assembly 200 for the ion implantation system according to a third aspect of the present invention. FIGS. 5B and 5C show a top view of further aspects of the energy filter assembly 200 according to the third aspect of the present invention. The energy filter assembly 200 for the ion implantation system according to the third aspect of the present invention comprises the same configuration as the filter assembly 1 in accordance with the first aspect of the present invention and the same configuration as the filter assembly 100 in accordance with the second aspect of the present invention. Thus, those elements having substantially the same function as those in the first and second aspects of the present invention will be numbered the same here and will not be described and/or illustrated again in detail here for the sake of brevity.

As can be seen in FIG. 5A, in the third aspect of the present invention, the energy filter assembly 200 further comprises at least one aperture element 60 arranged in a plane X, Y, which is perpendicular to the beam direction Z of the ion beam 10 irradiated via the ion beam source 5 (not shown). The energy filter assembly 200 further comprises a substrate 70, wherein the at least one aperture element 60 is arranged between the energy filter 25 and the substrate 70 such that a filtered ion beam 10*a* is transmitted to the substrate 70 and such that an unfiltered ion beam 10*b* is shuttered by the at least one aperture element 60. As can be seen in FIG. 5A, the substrate 70 can be fixed with respect to the transmitted ion beam 10*a*. However, the present invention is not limited thereto, the substrate 70 can also be movable in at least one of a first direction 70*a* and a second direction 70*b*, which are both perpendicular to the beam direction Z of the transmitted ion beam 10*a*.

In a further aspect of the energy filter assembly 200 according to the third aspect of the present invention, energy filter assembly 200 further comprises at least one detecting element 80, which scans the ion beam 10 in at least one minimal scanning area 80*a*, as can be seen best in FIGS. 5A and 5B. The at least one detecting element can be a Faraday Cup, but the present invention is not limited thereto.

In a further aspect of the energy filter assembly 200 according to the third aspect of the present invention, the at least one detecting element 80 scans the ion beam 10 in a scanning area 80*b*, wherein the scanning area 80*b* extends beyond the at least one detecting element 80, as can be seen best in FIG. 5C.

Figure 6:
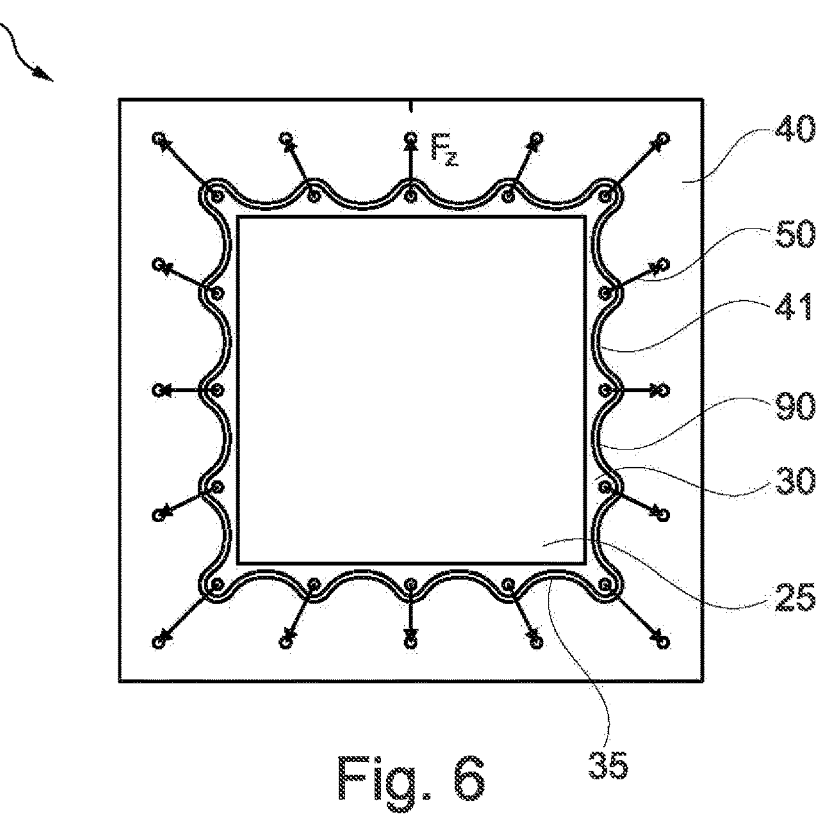
FIG. 6 shows a top view of an energy filter assembly for ion implantation system according to another aspect of the present invention with a preloaded coupling element for keeping the connection between the first filter frame and the energy filter under a controlled tension.
Figure 7A:
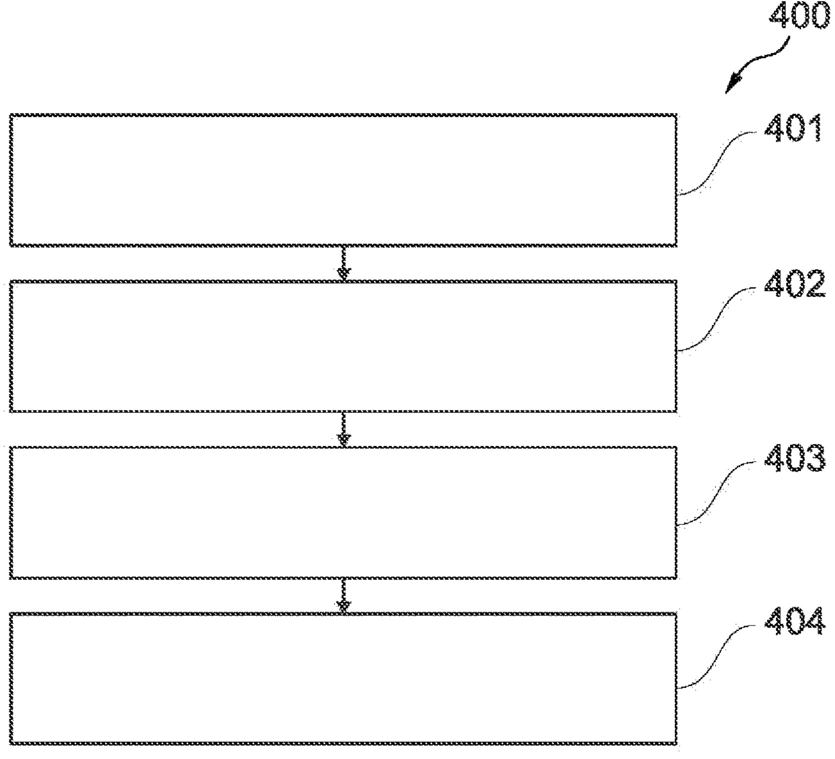
FIGS. 7A to 7E show a flow diagram of methods for manufacturing energy filter assemblies for ion implantation system according to the present invention.
Figure 7B:
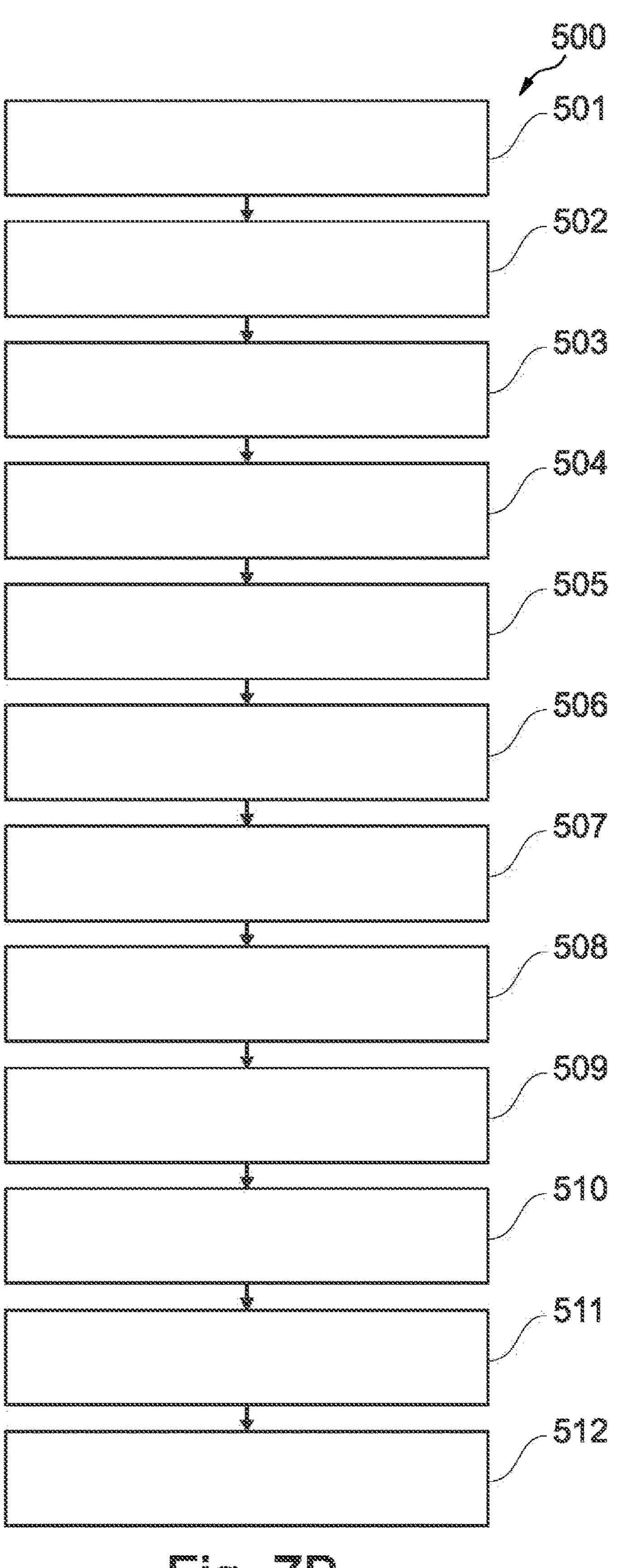
Figures 7C, 7D:
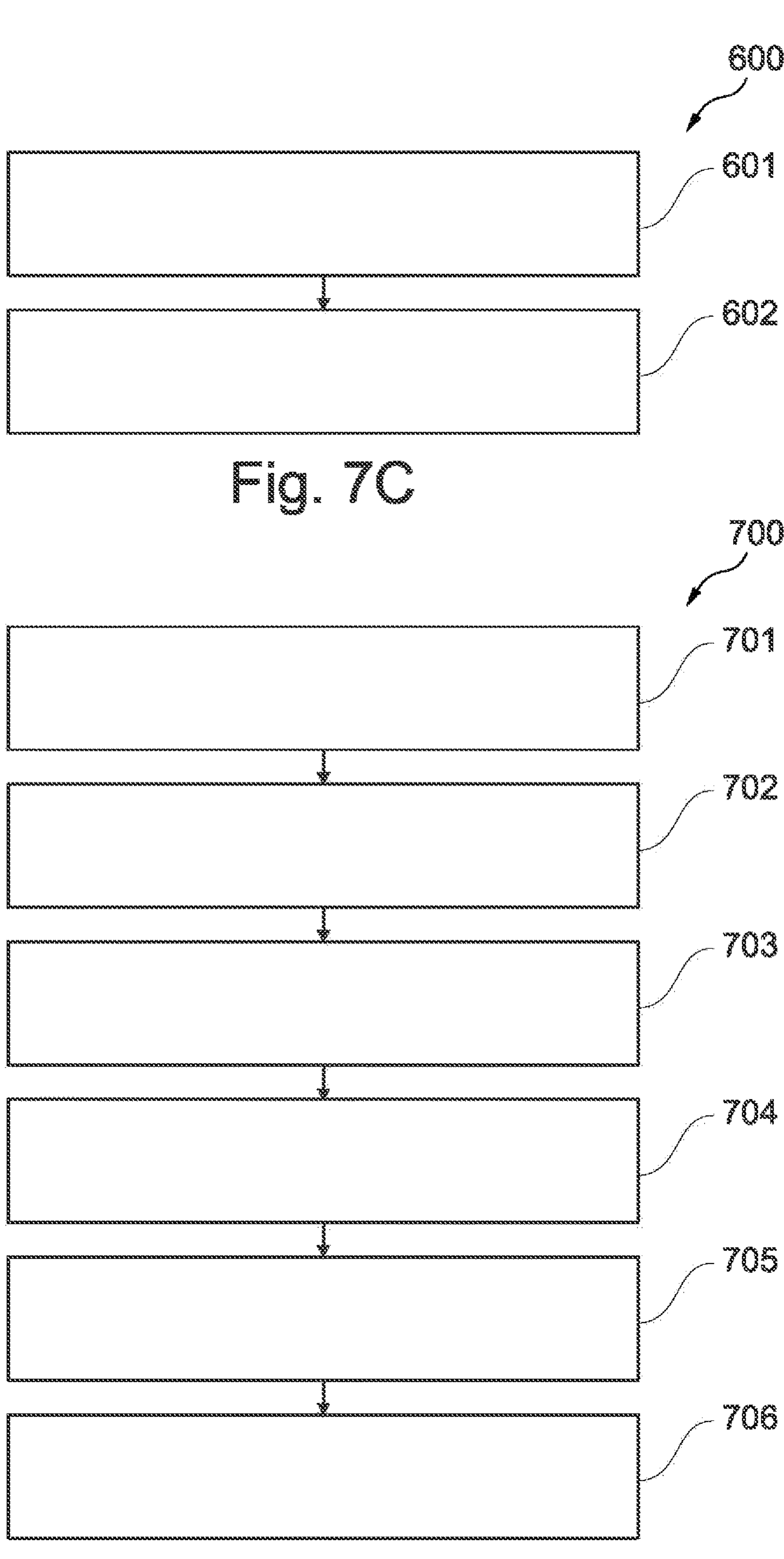
Figure 7E:
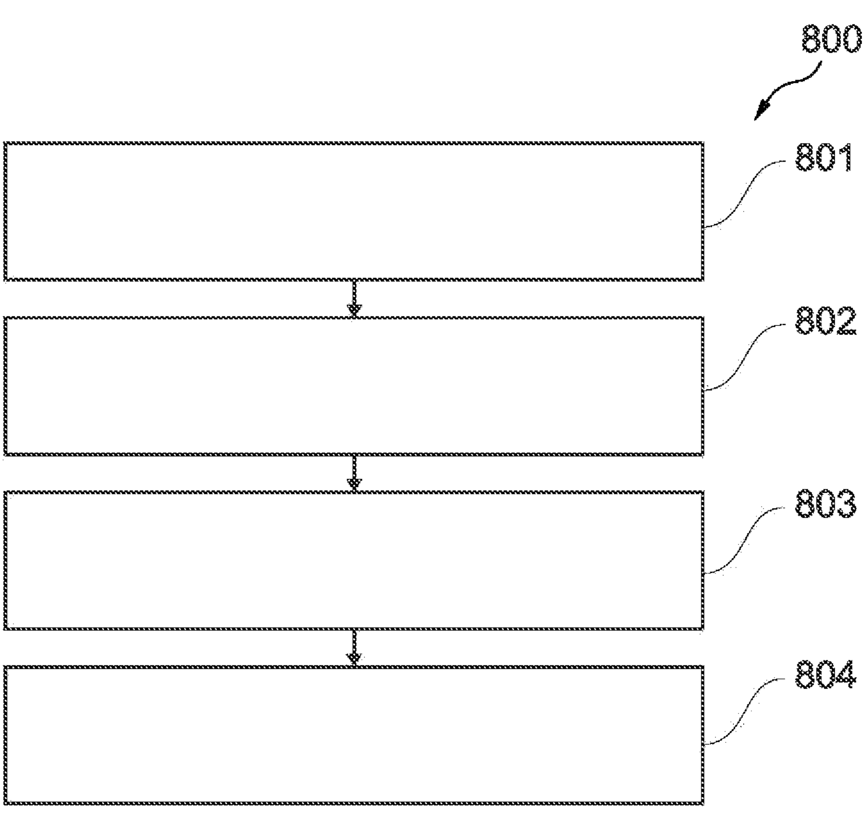

FIG. 6 shows a top view of an energy filter assembly 300 for ion implantation system according to a fourth aspect of the present invention. The energy filter assembly 300 for the ion implantation system according to the fourth aspect of the present invention comprises the same configuration as the filter assembly 1 in accordance with the first aspect of the present invention, the filter assembly 100 in accordance with the second aspect of the present invention, and the filter assembly 200 in accordance with the third aspect of the present invention. Thus, elements having substantially the same function as those in the first, second, and third aspects of the present invention will be numbered the same here and will not be described and/or illustrated again in detail here for the sake of brevity. The at least one coupling element 50 elastically connects the first filter frame 40 with the energy filter 25 via the second filter frame 30. However, the present invention is not limited thereto, the at least one coupling element 50 can also elastically connect the first filter frame 40 directly with the energy filter 25. In the energy filter assembly 300 of the fourth aspect of the present invention, the at least one coupling element 50 is preloaded for keeping the connection between the first filter frame 40 and the energy filter 25 under a controlled tension. The membrane of the energy filter 25 has a tendency to "swell", i.e. to form distortions. For example, the at least one coupling element 50 can be configured as a tension spring 50. The aim is to ensure that the membrane of the energy filter 25 retains its "flat stress state" as far as possible regardless of orientation (vertical/standing or horizontal/lying) and external loads (thermal and mechanical influences). Therefore, the membrane of the energy filter 25 is tensioned by evenly distributed preloaded tension springs 50 within the first filter frame 40 and the second filter frame 30. The membrane of the energy filter 25 can therefore be kept (substantially) smooth or flat by tensile stress, i.e. the controlled tension. The tension springs 50 are further configured so that a maximum tolerable tensile stress (depending on the material) with a corresponding safety factor (depending on the type and magnitude of the external loads) is not exceeded within the entire allowed temperature range during operation.

As can be seen in the top view of the energy filter assembly 300 in FIG. 6, the second filter frame 30 has a curved outline 35. For example, the second filter frame 30 has a wavy outline 35. The first filter frame 40 is configured such it is adapted to the curved outline of the second filter frame 30. Therefore, for example, the first filter frame 40 has a wavy or curved inner contour 41. As can be seen in FIG. 6, a gap 90 is provided between the outline 35 of the second filter frame 30 and the inner contour 41 of the first filter frame 40. As can be seen in FIG. 6, at least one coupling element 50 is provided to elastically connect the outline 35 of the second filter frame 35 and the inner contour 41 of the first filter frame 40. For example, the gap 90 is removed by laser ablation. By providing the gap 90, the energy filter 25 is separated from the first filter frame 40. The coupling element 50 creates therefore a flexible mechanical connection between the second filter frame 30 surrounding the energy filter 25 and the first filter frame 40. The curved outline 35 absorbs the forces of the at least one coupling element 50, in particular when the coupling element 50 is configured as a tension spring 50. Therefore, the effects of thermomechanical stresses can be further reduced.

As can be seen in FIG. 6, the first filter frame 40 and/or the second filter frame 30 can be provided with holes for attaching the tension springs 50 using 3D laser ablation. After installing the tension springs 50, the membrane of the energy filter 25 and the first filter frame 40 is decoupled from each other by specific cutting geometry (all mechanical and thermodynamic influences are taken into account). This cut can also be produced using 3D laser ablation.

In a further aspect of the energy filter assembly 300 according to the fourth aspect of the present invention, the preloaded at least one coupling element 50 is configured that the controlled tension on the energy filter 25 is below a maximal allowable tension including a safety value within the entire allowed temperature range during operation.

In a further aspect of the energy filter assembly 300 according to the fourth aspect of the present invention, the at least one coupling element 50 can be provided as a micro tension spring element. However, the present invention is not limited thereto, other preloaded elements can also be used, as needed and/or desired.

FIGS. 7A to 7E show a flow diagram of methods for manufacturing energy filter assemblies 1, 100, 200, 300 for the ion implantation system according to the present invention.

According to a fifth aspect of the present invention, a method 400 for manufacturing energy filter assemblies 1, 100, 200, 300 for ion implantation system is provided. The method 400 comprises the steps of: providing 401 an energy filter 25 having at least one filter element 25, which at least partially absorbs the beam energy of an ion beam 10; providing 402 a first filter frame 40; and connecting the first filter frame 40 with the energy filter 25 by at least one coupling element 50 for elastically connecting the first filter frame 40 with the energy filter 25. The method 400 further comprises the steps of: providing 403 a second filter frame 30, which accommodates the energy filter 25; and connecting 404 elastically the at least one coupling element 50 between the first filter frame 40 and the second filter frame 30.

According to a sixth aspect of the present invention, a method 500 for manufacturing energy filter assemblies 1, 100, 200, 300 for ion implantation system is provided. The method 500 comprises the steps of: providing 501 a silicon-on-insulator (SOI) wafer as a substrate material having a first surface and a second surface, wherein the thickness of a buried oxide (BOX) varies between 30 nm and 1.5 μm thickness; applying 502 a first masking material layer and a second masking material layer for masking wet chemical potassium hydroxide (KOH) etching or tetramethylammonium hydroxide (TMAH) etching to the first surface and the second surface of the SOI wafer; patterning 503 the first masking material layer and the second masking material layer on the first surface and the second surface by using a first and second lithography process step and at least one wet or dry etching patterning step; cleaning 504 of the first and second surfaces after patterning of the masking material layers; first wet chemical etching 505 of the first or second surfaces using KOH or TMAH etchant; removing 506 of the first masking material layer; applying 506 a third masking material layer on the first surface, for masking a KOH or TMAH wet etching step or dry etching step to the first surface of the SOI wafer; patterning 507 the third masking material layers on the first surface by using a third lithography process step and at least one wet or dry etching patterning step; applying 508 a KOH or TMAH wet etching step or dry etching step to the first surface of the SOI wafer stopping on the BOX layer; Second wet chemical etching 509 of the first or the second surface using KOH or TMAH etchant; third wet chemical etching or dry etching 510 of the second surface such that etching is stopped on the BOX layer; removing 511 of the BOX layer; and removing 512 of the masking layers on the first and second surfaces.

In a further aspect of the method 500 for manufacturing energy filter assemblies 1, 100, 200, 300 for ion implantation system, the method 500 comprises the steps of: applying 513 a first protective layer to the second surface to prevent etching. The method 500 can further comprise the step of applying 514 a second protective layer to the first or the second surface to prevent etching of the first surface.

According to a seventh aspect of the present invention, a method 600 for manufacturing energy filter assemblies 1, 100, 200, 300 for ion implantation system is provided. The method comprises the steps of: providing 601 a volume material slab; sequentially removing 602 of the material by a laser etching or mechanical erosive device, wherein the sequentially removing 602 is incremental several 10 nm up to several micrometer per step and involves several removal steps for a given structure, and wherein the sequentially removing 602 is performed according to a predefined 3-D layout of the energy filter 25, the first filter frame 40, and the at least one coupling element 50 for elastically connecting the first filter frame 40 with the energy filter 25.

According to an eighth aspect of the present invention, a method 700 for manufacturing energy filter assemblies 1, 100, 200, 300 for ion implantation system is provided. The method comprises the steps of: providing 701 a substrate or base layer; depositing 702 a first energy filter layer 32 for providing an energy filter 25 and a first filter frame layer 43 for providing a first filter frame 40; patterning 703 the first energy filter layer 32 and the first filter frame layer 43 using suitable etching techniques like masked etching or sequential etching by a laser or ion beam etching device; depositing and patterning sequentially 704 multiples of first energy filter layers 32 and first filter frame layers 43; removing, grinding or etching 705 the substrate or base layer to a desired substrate layer thickness or base layer thickness; and removing, grinding or etching 706 the first energy filter layers 32 and first filter frame layers 43 cutting out at least one coupling element 50 for elastically connecting the first filter frame 40 with the energy filter 25.

According to a ninth aspect of the present invention, a method 800 for manufacturing energy filter assemblies 1, 100, 200, 300 for ion implantation system is provided. The method 800 comprises the steps of: providing 801 an energy filter 25; providing 802 a first filter frame 40; creating 803 at least one elastic element 50 between the energy filter 25 and the first filter frame 40 by laser ablation; and separating 804 the energy filter 25 from first filter frame 40 by material ablation.

Figure 8:
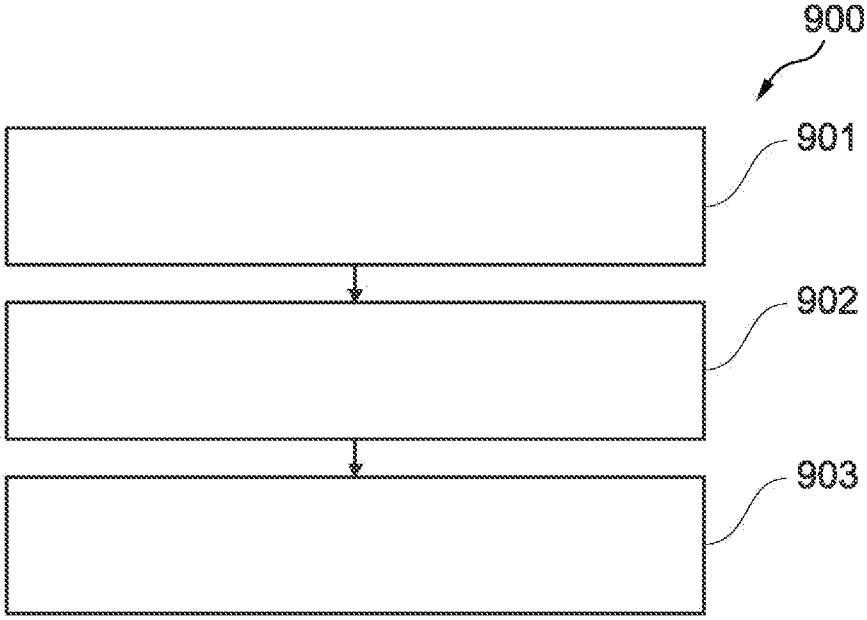
FIG. 8 show a flow diagram of a method for filtering ion implantation by using the energy filter assemblies for ion implantation system according to the present invention.

FIG. 8 show a flow diagram of a method 900 for filtering ion implantation by using the energy filter assemblies 1, 100, 200, 300 for ion implantation system according to a tenth aspect of the present invention. The method 900 comprises the steps of: providing 901 an energy filter assembly 1, 100, 200, 300 comprising an energy filter 25 with at least one filter element 25*a*, wherein a first filter frame 40 is elastically connected with the energy filter 25 by at least one coupling element 50 and wherein at least one aperture element 60 is arranged between the energy filter 25 and a substrate 70; providing 902 an ion beam 10, which extends across the energy filter 25, and the at least one coupling element 50; and arranging 903 the at least one aperture element 60 with respect to the direction of the ion beam 10, such that non-filtered ions 10*b* of the ion beam 10 are stopped from impacting on the substrate 70. The method 900 can further comprise that the ion beam 10 extends across the energy filter 25, the at least one coupling element 50 and at least partially the first filter frame 40. In particular, when the method 900 comprises that the ion beam 10 extends across the energy filter 25, the at least one coupling element 50 and at least partially the first filter frame, the scanning area extends beyond the at least one detecting element in form of a Faraday Cup.

In a further aspect of the method 900 for filtering ion implantation by using the energy filter assemblies 1, 100, 200, 300 for ion implantation system according to the tenth aspect of the present invention, the method 900 comprises the step of scanning 904 the ion beam 10 beyond the energy filter 25, the at least one coupling element 50, and the first filter frame 40 such that at least one detecting element 80 is irradiated.

From the above description of the present invention, those skilled in the art will perceive improvements, changes, and modifications on the present invention. Such improvements, changes, and modifications within the skill in the art are intended to be covered by the appended claims.

REFERENCE NUMERALS

1 energy filter assembly
5 Ion beam source
10 Ion Beam
20 Ion implementation device
21 Silicon layer
22 Silicon dioxide layer
23 Bulk silicon
25 Energy Filter
25*a* Filter element
30 Second filter frame
32 Energy filter layer
33 Second filter frame layer
35 Curved outline
40 First filter frame
41 Inner contour
43 First filter layer
50 Coupling element
60 Aperture element
70 Substrate
70*a* First direction
70*b* Second direction
80 Detecting element
80*a* Minimal scanning area
80*b* Scanning area
90 Gap
100 Energy filter assembly
200 Energy filter assembly
300 Energy filter assembly

The invention claimed is:

1. An energy filter assembly for ion implantation system, comprising:

an energy filter having at least one filter element absorbing the beam energy of an ion beam;

a first filter frame; and at least one coupling element for elastically connecting the first filter frame with the energy filter, wherein the at least one coupling element is preloaded for keeping the connection between the first filter frame and the energy filter under a controlled tension.

2. The energy filter assembly of claim 1, wherein the at least one coupling element is arranged at the at least one filter element of the energy filter.

3. The energy filter assembly of claim 1, further comprising a second filter frame accommodating the energy filter, wherein the at least one coupling elastically connects the first filter frame with the second filter frame.

4. The energy filter assembly of claim 1, wherein the at least one coupling element is configured as a micro spring element.

5. The energy filter assembly of claim 4, wherein the micro spring element has thickness of 6 μm, 16 μm or 100 μm.

6. The energy filter assembly of claim 4, wherein the micro spring element has width of 50 μm, 100 μm and a length of 100 μm up to several mm.

7. The energy filter assembly of claim 1, wherein the at least one coupling element is integrally formed with at least one of the energy filter and the first filter frame.

8. The energy filter assembly of claim 3, wherein the at least one coupling element is integrally formed with at least one of the first filter frame and the second filter frame.

9. The energy filter assembly of claim 1, wherein the at least one coupling element is connected to the energy filter and the first filter frame, and the second filter frame by laser welding or a bonding technique or at least one mechanical fixture.

10. The energy filter assembly of claim 1, wherein the at least one filter element is triangular prism-shaped or pyramidically shaped or a free form-shaped.

11. The energy filter assembly of claim 10, wherein the at least one filter element is arranged in a plane, which is perpendicular to the beam direction of the ion beam.

12. An energy filter assembly for ion implantation system, comprising:

an energy filter having at least one filter element absorbing the beam energy of an ion beam;

a first filter frame;

at least one coupling element for elastically connecting the first filter frame with the energy filter;

at least one aperture element arranged in a plane, which is perpendicular to the beam direction of the ion beam;

a substrate, wherein the at least one aperture element is arranged between the energy filter and the substrate such that a filtered ion beam is transmitted to the substrate; and at least one detecting element scanning the ion beam in at least one minimal scanning area, wherein the at least one detecting element is scanning the ion beam in a scanning area, wherein the scanning area extends beyond the at least one detecting element.

13. The energy filter assembly of claim 12, wherein the detecting element is a Faraday Cup.

14. The energy filter assembly of claim 1, wherein the at least one filter element is made of silicon, silicon carbide or carbon.

15. The energy filter assembly of claim 1, wherein the preloaded at least one coupling element is configured that the controlled tension on the energy filter is below a maximal tolerable tension including a safety value within the entire allowed temperature range during operation.

16. The energy filter assembly of claim 1, wherein the at least one coupling element is provided as a micro tension spring element.

17. The energy filter assembly of claim 1, wherein the second filter frame has a curved outline, and wherein the first filter frame has an inner contour, which is adapted to the curved outline such that a gap is provided between the outline of the second filter frame and the inner contour of the first filter frame.

18. A method for manufacturing an energy filter assembly for ion implantation system, comprising the steps of:

providing an energy filter having at least one filter element absorbing the beam energy of an ion beam;

providing a first filter frame; and connecting the first filter frame with the energy filter by at least one coupling element for elastically connecting the first filter frame with the energy filter.

19. The method of claim 18, further comprising providing a second filter frame accommodating the energy filter; and connecting elastically the at least one coupling element between the first filter frame and the second filter frame.

20. A method for filtering ion implantation, the method comprising the steps of:

providing an energy filter assembly comprising an energy filter having at least one filter element, wherein a first filter frame is elastically connected with the energy filter by at least one coupling element and wherein at least one aperture element is arranged between the energy filter and a substrate;

providing an ion beam extending across the energy filter, and the at least one coupling element; and arranging the at least one aperture element with respect to the direction of the ion beam, such that non-filtered ions of the ion beam are stopped from impacting on the substrate.

21. The method of claim 20, further comprising:

scanning the ion beam beyond the energy filter, the at least one coupling element, and the first filter frame such that at least one detecting element is irradiated.

22. A method for manufacturing an energy filter for an ion implantation system, wherein the energy filter assembly comprises a first filter frame and at least one coupling element, and wherein method comprises the steps of:

providing a silicon-on-insulator wafer as a substrate material having a first surface and a second surface, wherein the thickness of a buried oxide varies between 30 nm and 1.5 μm thickness;

applying a first masking material layer and a second masking material layer for masking wet chemical potassium hydroxide etching or tetramethylammonium hydroxide etching to the first surface and the second surface of the SOI wafer;

patterning the first masking material layer and the second masking material layer on the first surface and the second surface by using a first and second lithography process step and at least one wet or dry etching patterning step;

cleaning of the first and second surfaces after patterning of the masking material layers;

first wet chemical etching of the first or second surfaces using KOH or TMAH etchant;

removing of the first masking material layer;

applying a third masking material layer on the first surface, for masking a KOH or TMAH wet etching step OR dry etching step to the first surface of the SOI wafer;

patterning the third masking material layers on the first surface by using a third lithography process step and at least one wet or dry etching patterning step;

applying a KOH or TMAH wet etching step OR dry etching step to the first surface of the SOI wafer stopping on the BOX layer;

second wet chemical etching of the first or the second surface using KOH or TMAH etchant;

third wet chemical etching or dry etching of the second surface such that etching is stopped on the BOX layer;

removing of the BOX layer; and removing of the masking layers on the first and second surfaces.

23. The method of claim 22, applying a first protective layer to the second surface to prevent etching.

24. The method of claim 22, applying a second protective layer to the first or the second surface to prevent etching of the first surface.

25. A method for manufacturing an energy filter assembly for an ion implantation system, the method comprising the steps of:

providing a volume material slab;

sequentially removing of the material by a laser etching or mechanical erosive device, wherein the removing is incremental several 10 nm up to several micrometer per step and involves several removal steps for a given structure, and wherein the sequentially removing is performed according to a predefined 3-D layout of an energy filter, a first filter frame, and at least one coupling element for elastically connecting the first filter frame with the energy filter.

26. A method for manufacturing an energy filter assembly for an ion implantation system, the method comprising the steps of:

providing a substrate or base layer;

depositing a first filter layer for providing an energy filter and a first filter frame layer for providing a first filter frame;

patterning the first filter layer and the first filter frame layer using suitable etching techniques like masked etching or sequential etching by a laser or ion beam etching device;

depositing and patterning sequentially multiples of first filter layers and first filter frame layers;

removing, grinding or etching the substrate or base layer to a desired substrate layer thickness or base layer thickness; and removing, grinding or etching the first filter layers and first filter frame layers cutting out at least one coupling element for elastically connecting the first filter frame with the energy filter.

27. A method for manufacturing an energy filter assembly for an ion implantation system, the method comprising the steps of:

providing an energy filter;

providing a first filter frame;

creating at least one elastic element between the energy filter and the first filter frame by laser ablation; and separating the energy filter from first filter frame by material ablation.

28. The energy filter assembly of claim 12, wherein the substrate is fixed with respect to the transmitted ion beam or movable in at least one of a first direction and a second direction perpendicular to the beam direction of the transmitted ion beam.

* * * * *